United States Patent [19]
Hamakawa et al.

[11] Patent Number: 5,993,073
[45] Date of Patent: Nov. 30, 1999

[54] SEMICONDUCTOR LASER MODULE

[75] Inventors: Atsushi Hamakawa; Masakazu Shigehara, both of Yokohama, Japan

[73] Assignee: Sumitomo Electric Industries, Ltd., Osaka, Japan

[21] Appl. No.: 09/026,529

[22] Filed: Feb. 20, 1998

[30] Foreign Application Priority Data

Feb. 21, 1997 [JP] Japan ................................... 9-053942
Jan. 13, 1998 [JP] Japan ................................. 10-018257

[51] Int. Cl.⁶ ....................................................... G02B 6/36
[52] U.S. Cl. ................................................................ 385/88
[58] Field of Search .............................. 385/88–92, 93; 359/281; 372/42, 43

[56] References Cited

U.S. PATENT DOCUMENTS

| | | | |
|---|---|---|---|
| 4,146,792 | 3/1979 | Stenzel et al. | 250/365 |
| 5,074,682 | 12/1991 | Uno et al. | 385/93 |
| 5,162,928 | 11/1992 | Taniguchi et al. | 359/13 |
| 5,353,294 | 10/1994 | Shigeno | 372/43 |
| 5,388,171 | 2/1995 | Michikoshi et al. | 385/36 |
| 5,452,122 | 9/1995 | Tsuneda et al. | 359/281 |
| 5,485,481 | 1/1996 | Ventrudo et al. | 372/6 |
| 5,589,684 | 12/1996 | Ventrudo et al. | 250/225 |
| 5,684,902 | 11/1997 | Tada | 385/88 |
| 5,751,877 | 5/1998 | Ushizaka et al. | 385/93 |
| 5,759,419 | 6/1998 | Mochida et al. | 369/121 |
| 5,774,616 | 6/1998 | Matsuda | 385/89 |

FOREIGN PATENT DOCUMENTS

| | | |
|---|---|---|
| 611097A1 | 8/1994 | European Pat. Off. . |
| 650083A2 | 4/1995 | European Pat. Off. . |
| 739067A1 | 10/1996 | European Pat. Off. . |
| 94/17448 | 8/1994 | WIPO . |

OTHER PUBLICATIONS

Huhse, et al., "Fast Wavelength Switching of Semiconductor Laser Pulses by Self–seeding", Applied Physics Letters, vol. 69, No. 14, Sep. 1996, pp. 2018–2020.

Morton, et al., "Stable Single Mode Hybrid Laser With High Power and Narrow Linewidth", Applied Physics Letters, vol. 64, No. 20, May 1994, pp. 2634–2636.

Yu, et al., Fourier–Transform–Limited 2.5PS Light Pulses with Electrically Tunable Wavelength (15nm) by Hybridly Modelocking a Semiconductor Laser in a Chirped Bragg Grating Fibre External Cavity, Electronics Letters, vol. 31, No. 23, Nov. 1995, pp. 2008–2009.

Hamakawa, et al., "Wavelength Stabilisation of 1.48 MUM Pump Laser by Fiber Grating", ECOC 96, 22nd European Conference on Optical Communication, Sep. 1996, vol. 1, pp. 119–122.

B.F. Ventrudo, et al, Wavelength and intensity stabalisation of 980nm diode lasers coupled to fibre Bragg gratings, Electronic Letters vol. 30, No. 25, Dec. 8, 1994, pp. 2147–2149.

W.W. Morey, et al, Tunable Narrowband External–Cavity Diode Laser with an Embedded Fiber Grating Reflector, LEOS Conf. Digest, New Semiconductor Laser Devices and Applications, 1990, pp. 16–17.

Atsushi Hamakawa et al, Wavelength Stabalization of 1.48 um Pump Laser By Fiber Grating, ECOC, 1996, (3 sheets).

*Primary Examiner*—Akm E. Ullah
*Attorney, Agent, or Firm*—Pillsbury Madison & Sutro LLP

[57] ABSTRACT

A semiconductor laser module in which: the distance between a semiconductor laser chip and a diffraction grating can be shortened; the light output spectrum is stabilized; and the output characteristic does not fluctuate due to the external condition. In the semiconductor laser module, a diffraction grating structure is constituted in an optical fiber by at least two diffraction gratings for reflecting light with different wavelengths respectively. The diffraction grating structure is formed in a place corresponding to the inside of the package or the inside of the coupling means.

12 Claims, 8 Drawing Sheets

$\lambda_1$ = 1479nm
$\lambda_2$ = 1481nm
$R_1 = R_2$ = 3%
$\Delta\lambda_1 = \Delta\lambda_1$ = 3nm

SEMICONDUCTOR LASER MODULE

BACKGROUND OF THE INVENTION

The present invention relates to a semiconductor laser module, and particularly relates to a semiconductor laser module having a fiber grating (FG) (or embedded fiber grating reflector) structure which is formed from a diffraction grating incorporated in an optical fiber.

Heretofore, a method in which a fiber grating or embedded fiber grating reflector structure (sometimes abbreviated to "FG structure") is formed from a diffraction grating incorporated in an optical fiber receiving laser light emitted from a laser diode is often employed in a semiconductor laser module. By using the fiber grating, stabilization of the wavelength (for example, 0.98 µm band) of emitted laser light from the module can be attained and this wavelength can be controlled (for example, ELECTRONIC LETTERS Vol. 30 No. 25 (1994. 12. 8), p. 2147–2149, LEOS Conf. Digest, New Semiconductor Laser Devices and Applications (1990)). The semiconductor laser module of this type is popularly used in optical fiber communication, or the like. For example, as a semiconductor laser module in which a single fiber grating is incorporated, it is known that in which a fixed pitch of refractive index variation grating (FG) is formed in a place distanced by 10 cm to the order of meters from the laser chip, that is, from an end surface of the optical fiber is known.

In the case where this fiber grating (FG) is present in the outside of the package in which the laser chip is installed, the optical fiber between the laser diode (LD) and the fiber grating (FG) may suffer from stress such as bending or stretching. In a resonator formed between the laser diode and the fiber grating, the state of light polarization changes easily because of the stress of the optical fiber. Accordingly, the output characteristics of the laser module fluctuates easily.

In the case of a light-emitting module in which a fiber grating is incorporated, it may be thought of to insert an optical fiber into a tubular structure called "ferrule" and incorporate a diffraction grating in the optical fiber in the ferrule so that the optical fiber is protected from such disturbance.

If the FG diffraction grating is incorporated in such a structure, however, the distance between the laser diode chip (strictly, the light emitting surface thereof) and the diffraction grating is shortened. Accordingly, the output characteristics of the module become unstable, because wavelength difference of the longitudinal mode, which is defined by the distance between the laser chip and FG, is large and the contribution of each mode is reflected more clearly to the output of the module. This results as kinks in the optical output power characteristics against the external conditions such as driving current and operating temperature.

Hence, it has been difficult to incorporate a fiber grating structure into a ferrule.

SUMMARY OF THE INVENTION

It is therefore a main object of the present invention to provide a semiconductor laser module in which: the distance between a semiconductor laser chip and a diffraction grating can be shortened; the light output spectrum is stabilized; and the output characteristic does not fluctuate due to the external condition.

It is another object of the present invention to provide a semiconductor laser module of a compact structure in which: stabilized output characteristic is obtained; and the size in the direction of the optical path can be more shortened.

The above objects can be achieved, according to a first feature of the present invention, by a semiconductor laser module comprising a semiconductor laser chip for emitting light, a package in which the semiconductor laser chip is installed, an optical fiber having a diffraction grating structure for reflecting light with a predetermined wavelength selected from the emitted light of the semiconductor laser chip, and a coupling means for coupling the package and the optical fiber to each other, wherein the diffraction grating structure is constituted by at least two diffraction gratings for reflecting light with different wavelengths respectively and is formed in a place corresponding to the inside of the package or the inside of the coupling means.

The above objects can be achieved, according to a second feature of the present invention, by a semiconductor laser module comprising a semiconductor laser chip for emitting light, a package in which the semiconductor laser chip is installed, an optical fiber having a diffraction grating structure for reflecting light with a predetermined wavelength selected from the emitted light of the semiconductor laser chip, and a coupling means for coupling the package and the optical fiber with each other, wherein the diffraction grating structure includes at least one chirped grating in which a physical period of refractive index variation changes continuously and which is formed in a place corresponding to the inside of the package or the inside of the coupling means.

As described above, in a semiconductor laser module comprising a package in which the semiconductor laser chip is installed, an optical fiber having a fiber grating (FG) for reflecting light with a predetermined wavelength selected from the emitted light of the semiconductor laser chip, and a coupling means for coupling the package and the optical fiber with each other, the present invention is configured so that the FG is formed in a place corresponding to the inside of the package or the inside of the coupling means. Further, according to the first feature of the invention, the FG is constituted by at least two diffraction gratings for reflecting light with different wavelengths respectively, while according to the second feature of the invention, the FG is constituted by a chirped grating in which the physical period of the refractive index variation changes continuously.

Because the fiber grating (FG) is thus formed in a place corresponding to the inside of the package or the inside of the coupling means, according to the present invention, a resonator formed between the semiconductor laser chip (LD) and the FG is prevented from being affected by bending or stretching caused by disturbance.

Furthermore, according to the first feature of the present invention, the FG is constituted by at least two diffraction gratings for reflecting light with different wavelengths respectively. Even in the case where the distance between the LD and the FG is selected to be short, the light output characteristic is not affected by the change of environment such as temperature, etc., and is stabilized.

Further, these at least two diffraction gratings can be fabricated suitably by performing overwriting in one and the same region of the optical fiber. That is, when a plurality of FGs with different reflection wavelengths are superimposed in one and the same place of the optical fiber, not only the FG producing region can be reduced but also light output characteristic free from kinks can be obtained.

Further, according to the second feature of the present invention, the FG is constituted by a chirped grating in which the physical period of the refractive index variation changes continuously. As well known, the chirped grating is a grating in which each grating distance changes continuously and monotonously. Accordingly, also in this configuration, stabilized light output spectrum is obtained in the same manner as in the case described above even in the case where the distance between the LD and the FG is shortened. Consequently, the light output characteristic is not affected by the change of ambient environment such as temperature, etc.

Although other features and advantages of the present invention will be understood clearly from the following description of embodiments in connection with accompanying drawings, the scope of the present invention is not limited by the description but limited only by the scope of Claim.

Fig, 5 is a graph showing an example of characteristic in the case of the prior art.

Figure 6:
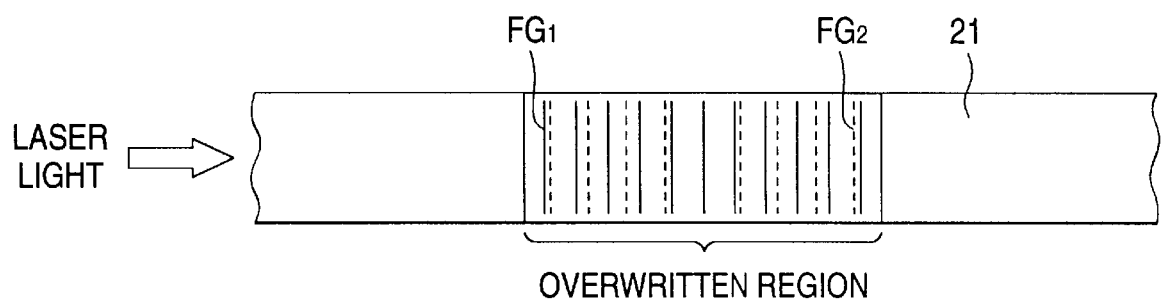

FIG. 6 is an enlarged longitudinally sectioned view schematically showing a main part of another mode of FG formation in an embodiment of the present invention.

Figure 7:
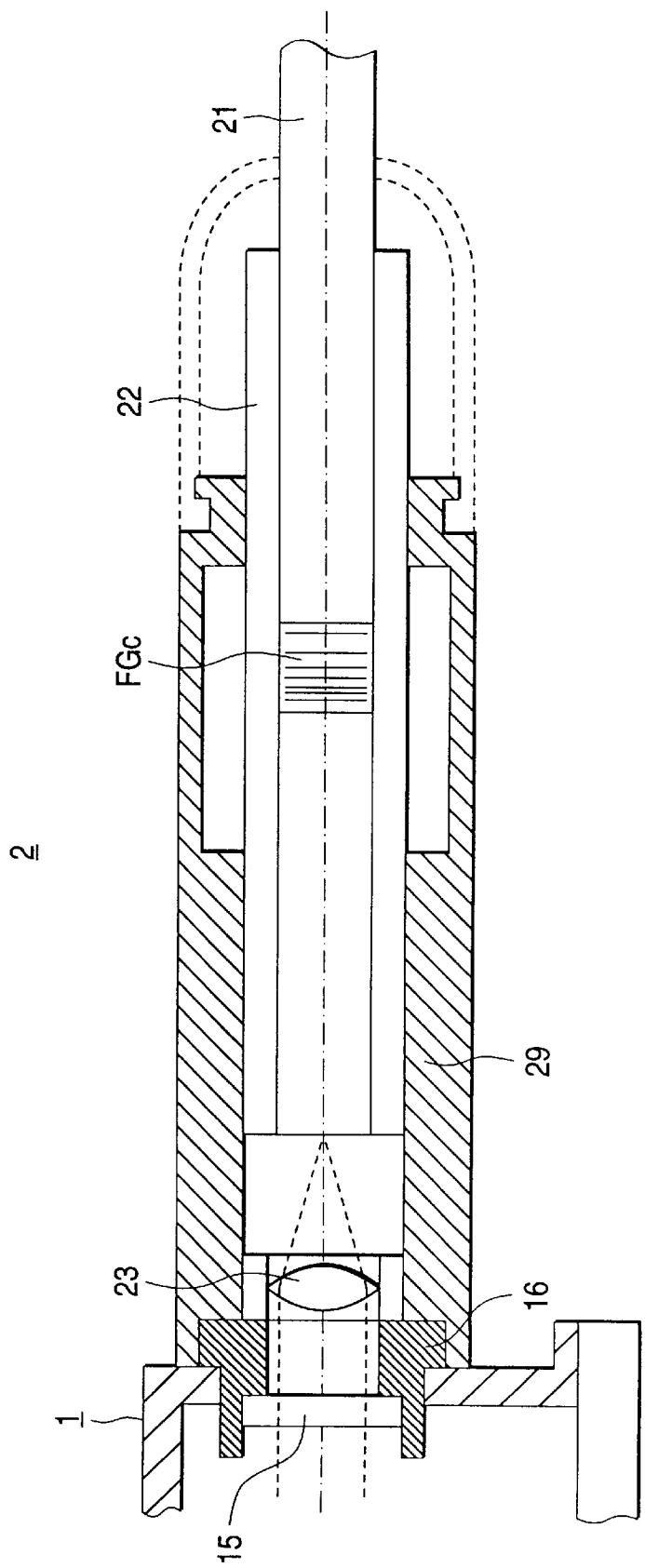

FIG. 7 is a longitudinally-sectioned view schematically showing a main part of the semiconductor laser module according to another embodiment of the present invention.

Figure 8:
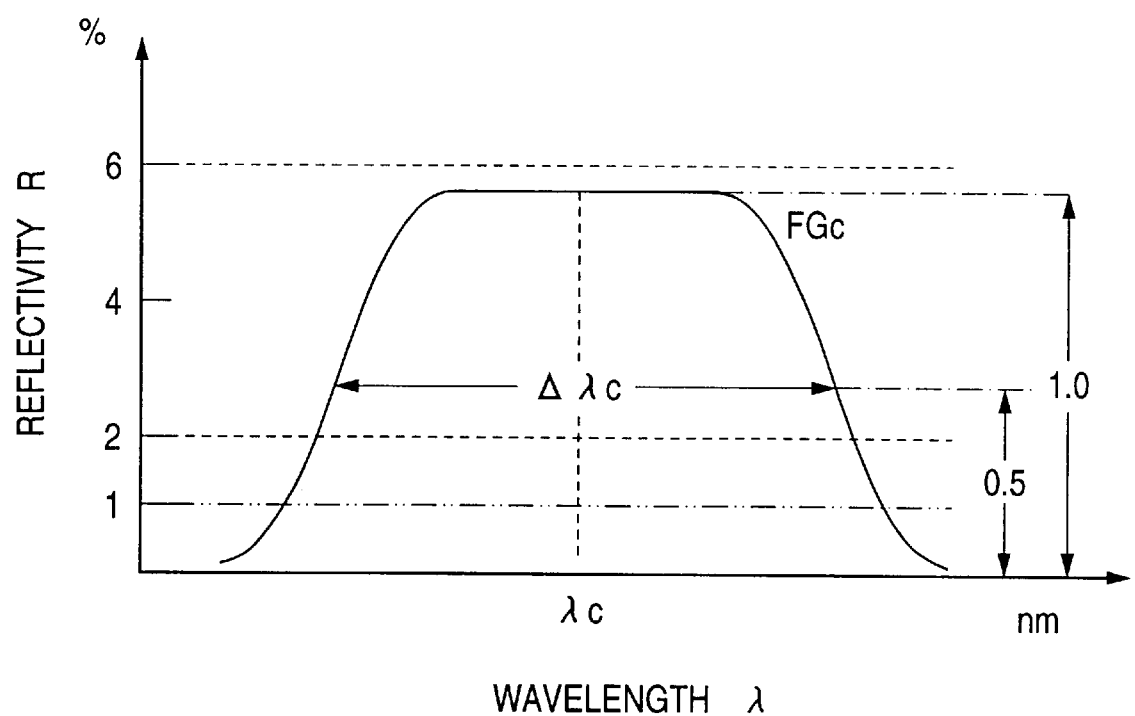

FIG. 8 is a graph showing the FG reflection spectral characteristic of another diffraction grating.

Figure 9:
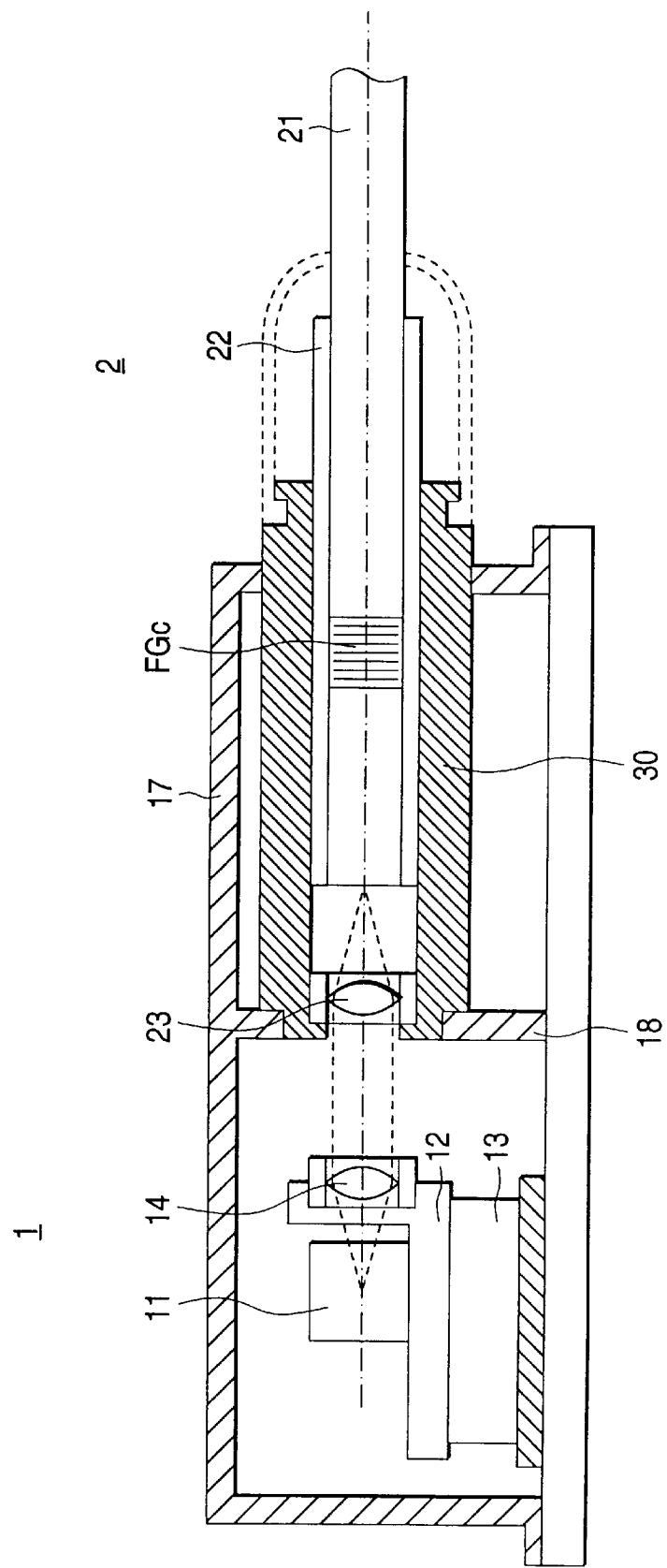

FIG. 9 is a longitudinally-sectioned view schematically showing the semiconductor laser module according to a further modified embodiment of the present invention.

Figure 10:
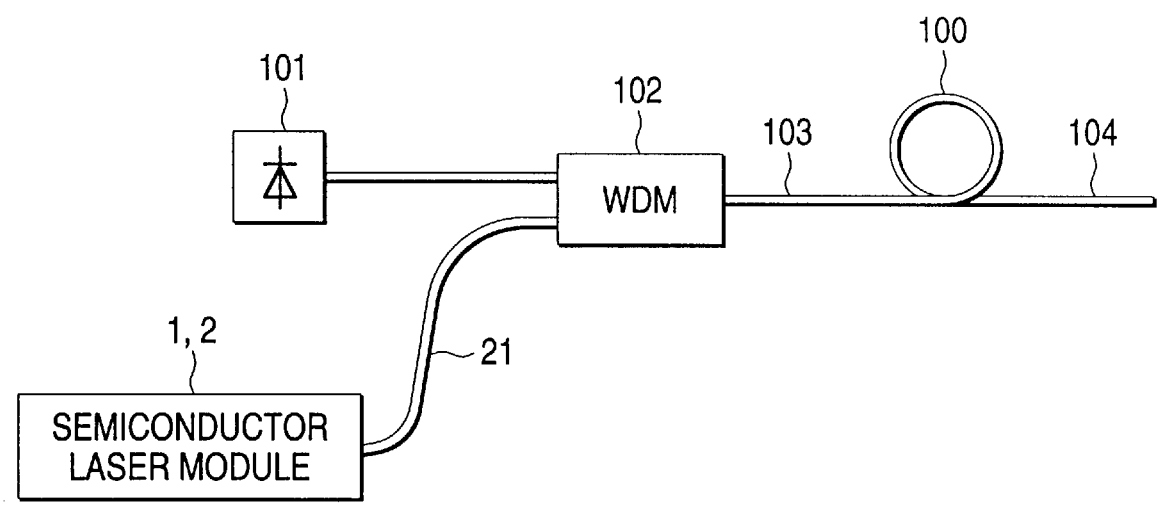

FIG. 10 schematically shows an optical fiber amplifier using the semiconductor laser module according to the present invention.

DETAILED DESCRIPTION OF THE PREFERRED EMBODIMENTS

Figure 1:
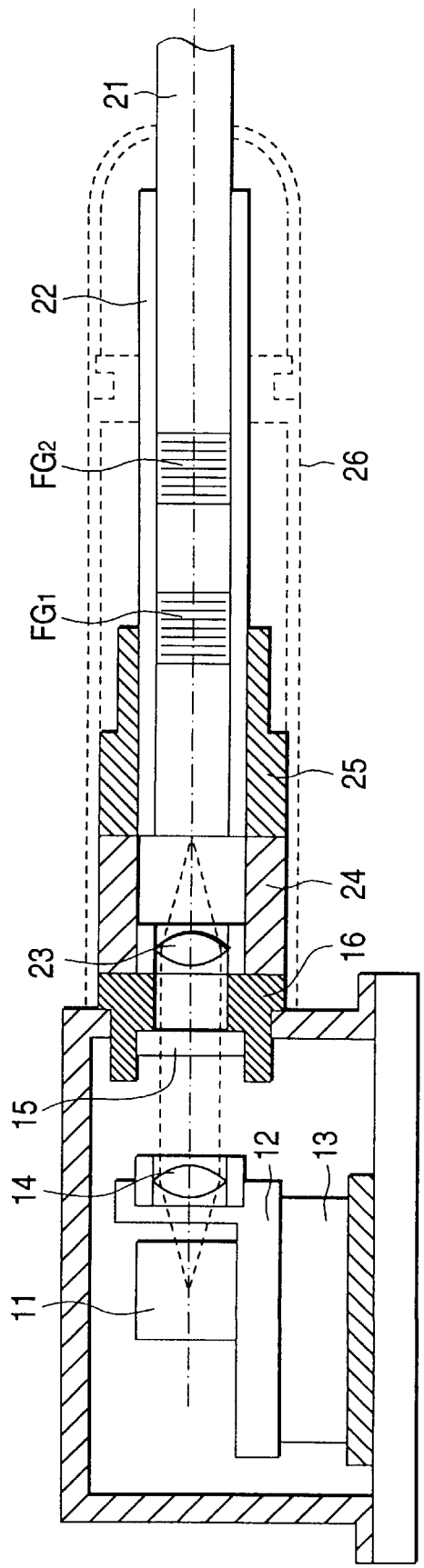
FIG. 1 is a longitudinally-sectioned view schematically showing a semiconductor laser module according to an embodiment of the present invention.

FIG. 1 shows a schematic longitudinally-sectioned view of a semiconductor laser module according to an embodiment of the present invention. This semiconductor laser module comprises mainly an LD package 1, and an FG connector 2. A semiconductor laser chip 11 is installed in the LD package 1. This semiconductor laser chip 11 is mounted on a chip carrier 12. When driven by an electrical drive circuit not shown, the semiconductor laser chip 11 can emit light correspondingly. The reflectivity of the light-exit surface of the semiconductor laser chip 11 is preferably selected to be not larger than 2% from a reason which will be described later.

Further, the chip carrier 12 is fixed to a bottom portion of the LD package 1, for example, through a cooling means 13. This cooling means 13 is constituted by a heat radiating element such as a Peltier effect element. This cooling means 13 gives an appropriate heat radiating function to the laser chip 11 when the cooling means 13 is driven.

A first lens 14 called "collimate lens" may be further provided in the LD package 1. This first lens 14 is supported on the chip carrier 12 at the light-exit side while the optical axis of the first lens 14 is made coincident with the optical axis of the semiconductor laser chip 11. A coupling means 16 having hermetic glass 15 is fitted into an opening opposite to this lens. Accordingly, the emitted light from the laser chip 11 is led into the FG connector 2.

On the other hand, the FG connector 2 is mainly composed of an optical fiber 21, and a ferrule 22. Diffraction gratings are incorporated in this optical fiber 21 so that so-called "fiber grating (FG)" structures are formed. The fiber grating structures can be formed by a suitable method such as a Holographic method, a method using X-ray radiation to obtain a desired refractive index change. According to a first feature of the present invention, the structures are formed from at least two diffraction gratings $FG_1$ and $FG_2$ having functions of reflecting light with different wavelengths respectively.

Optical elements such as a second lens 23 for collecting light, etc. can be disposed in an optical path between the optical fiber 21 and the first lens 14. An isolator (not shown) can be disposed in the output side of the diffraction grating $FG_2$. These optical elements can be wholly or partly provided in the LD package 1 or FG connector 2. In the example shown in FIG. 1, the second lens 23 is provided in a support portion 24 while the optical axis of the second lens 23 coincides with the optical axis of the laser output light from the semiconductor laser chip 11.

The optical fiber 21 is inserted in the inside of the ferrule 22. The ferrule 22 is fixed to the LD package 1 through a sleeve 25. For example, this sleeve 25 is fixed together with the optical system support portion 24 to the coupling means 16 by a suitable bonding means as shown in the drawing. A main function of this ferrule 22 is to provide a connection means for supporting the optical fiber 21 to optically connect the optical fiber 21 to the LD package 1 and a protection means for protecting the optical fiber 21 from stress in terms of disturbance.

Further, the FG connector 2 is wholly supported and protected by a connector cover 26 represented by the broken line. The structure of the FG connector 2 can be changed as exemplified in FIG. 2. In the example shown in this drawing, the ferrule 22 is supported by an integrated connector sleeve 28 so that the connector structure is simplified more greatly.

Figure 2:
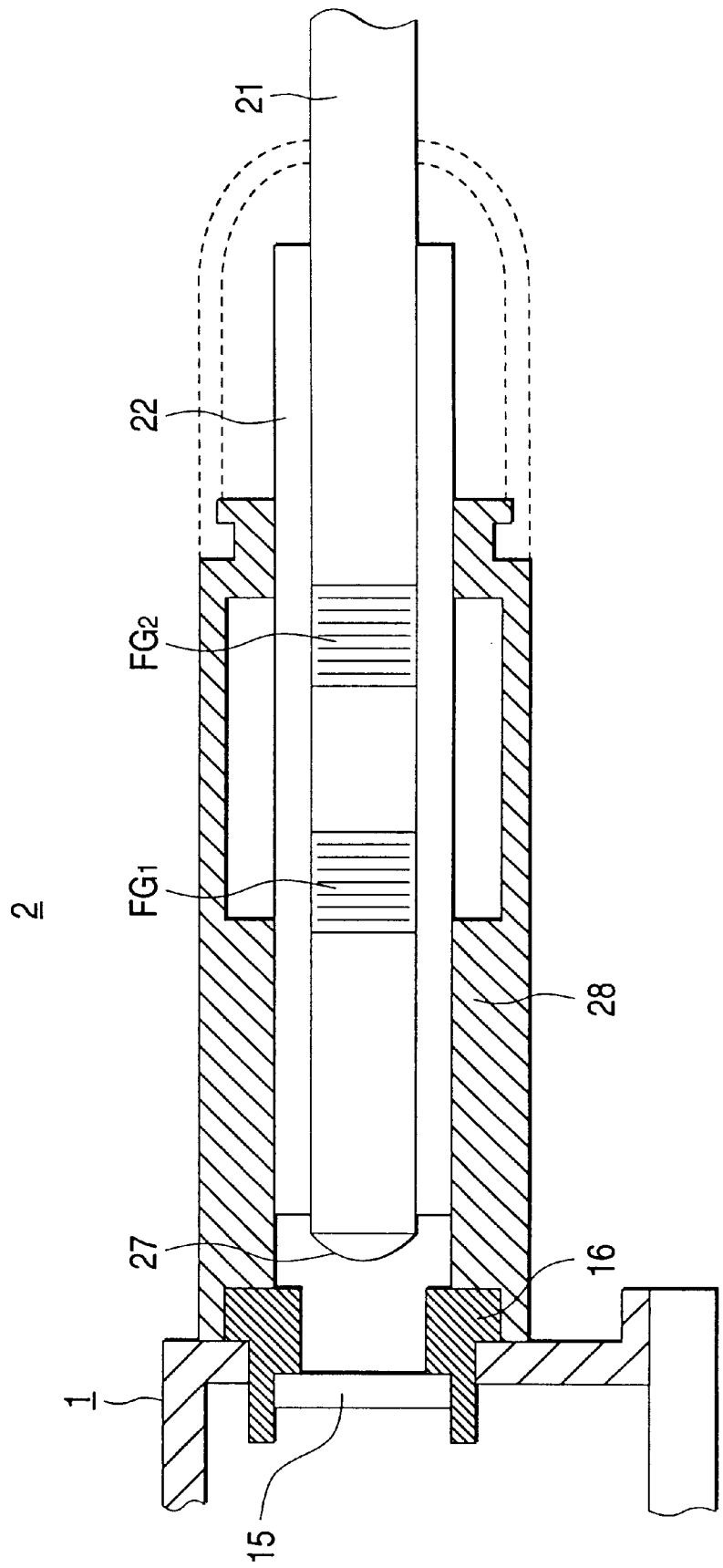
FIG. 2 is a longitudinally-sectioned view schematically showing part of the semiconductor laser module according to a modified embodiment of the present invention.

In FIG. 2, an end of the optical fiber 21 is spherically processed so that an optical lens portion 27 called "hemispherical fiber-lens" is formed instead of both the first and second lenses or instead of the second lens 23. By use of the optical lens portion 27, the total efficiency is improved in cooperation with the feature of the fiber grating as will be described later, so that the light output power from the module can be increased. Further, by use of the optical lens portion 27, the size of the module in the direction of the optical path can be reduced.

According to the first feature of the present invention, the optical fiber 21 has at least two diffraction gratings $FG_1$ and $FG_2$ as fiber grating (FG) structures as described above. These diffraction gratings $FG_1$ and $FG_2$ have functions of reflecting light with different wavelengths $\lambda_1$ and $\lambda_2$ respectively, so that equal-width gratings having different physical periods of refractive index variation to each other are formed as shown simply in FIG. 1.

The reflection bandwidth of the FG can be expanded even in the case where the diffraction gratings $FG_1$ and $FG_2$ of with different wavelengths $\lambda_1$ and $\lambda_2$ respectively are achieved by overwriting in one and the same region of the optical fiber as will be described later.

Hence, according to the invention, I-L characteristic (characteristic of output light intensity L of the module with respect to a current I applied to the LD) free from kinking can be provided even in the case where the distance between the semiconductor laser chip (LD) 11 and each fiber grating $FG_1$, $FG_2$ takes a short value not greater than 10 cm, such as 2 cm.

Figure 3:
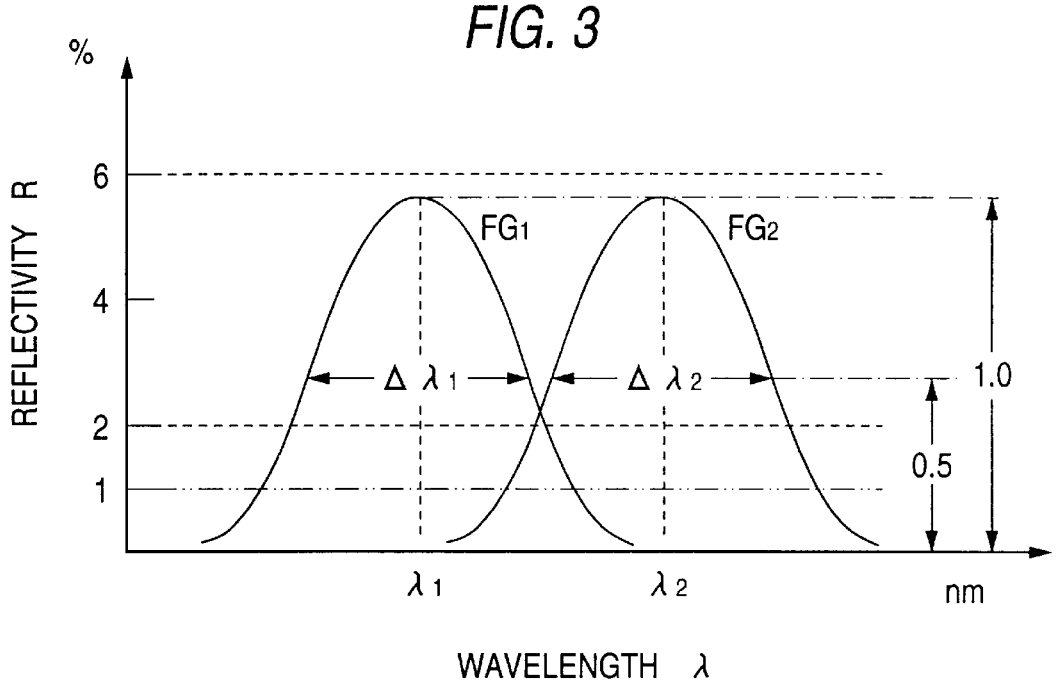
FIG. 3 is a graph showing the FG reflection spectral characteristic of a diffraction grating.

FIG. 3 shows FG reflection spectrum (reflectivity (R)-wavelength ($\lambda$) characteristic) for explaining the characteristic of a diffraction grating employed as an FG structure. In the case where two diffraction gratings $FG_1$ and $FG_2$ are produced successively in order of the nearer to the input end surface of the optical fiber 21 according to the first feature of the present invention, the reflectivities $R_1$ and $R_2$, wavelengths $\lambda_1$ and $\lambda_2$ and line widths $\Delta\lambda_1$ and $\Delta\lambda_2$ of the diffraction gratings $FG_1$ and $FG_2$ are preferably selected to satisfy the following relations:

$\lambda_1 < \lambda_2$, $R_1, R_2 \leq 6\%$,
  preferably,
  $2\% \leq R_1, R_2 \leq 6\%$, $\Delta\lambda_1, \Delta\lambda_2 \geq 2$ nm,
  preferably,
  $2$ nm $\leq \Delta\lambda_1, \Delta\lambda_2 \leq 16$ nm, and $|\lambda_1 - \lambda_2| \leq 10$ nm.

When each of the reflectivities $R_1$ and $R_2$ of the diffraction gratings $FG_1$ and $FG_2$ is selected to be not larger than 6%, characteristic free from kinks can be obtained compared with the case where the reflectivity is larger than 6%. Further, if each of the reflectivities $R_1$ and $R_2$ is selected to be not smaller than 2%, oscillation at a Bragg wavelength can be obtained compared with the case where the reflectivity is smaller than 2%.

With respect to a Bragg wavelength, as well known, when light is input to a diffraction grating, only the light with a wavelength equal to an integer multiple of the physical period of the diffractive index variation is reflected selectively. The wavelength of light at that point is called a "Bragg wavelength" ($\lambda = 2n\Lambda$ n: effective index, $\Lambda$: period of refractive index change).

Further, when the lower limit of each of the reflectivities $R_1$ and $R_2$ of the diffraction gratings $FG_1$ and $FG_2$ is selected to be not smaller than 1% as represented by the two-dot chain line in FIG. 3. The value of the total reflectivity R which is the sum of these reflectivities $R_1$ and $R_2$ is selected to be in a range of from 2 to 6%, preferred oscillation with a Bragg wavelength can be also obtained. That is, $1\% \leq R_1, R_2 \leq 6\%$, or $2\% \leq R \leq 6\%$ is a preferred value concerning the reflectivities of these diffraction gratings.

When each of the band widths $\Delta\lambda_1$ and $\Delta\lambda_2$ of the diffraction gratings $FG_1$ and $FG_2$ is selected to be not smaller than 2 nm, characteristic free from kinks can be obtained compared with the case where the band width is smaller than 2 nm. When each of the band widths $\Delta\lambda_1$ and $\Delta\lambda_2$ is selected to be not larger than 16 nm, a light output bandwidth of the module effective for excitation of EDF (Erbium-Doped Fiber), for example, not larger than about 10 nm can be obtained. FIG. 10 shows an example of EDFA (Erbium-Doped Fiber Amplifier) in which the semiconductor laser module constructed by the LD package 1 and the FG connector 2 according to the present invention is employed for excitation of EDF. In FIG. 10, reference numeral 100 designates an erbium-doped fiber; 101, a light source for generating a signal beam; 102, a wavelength multiplexer/demultiplexer (WDM) to which excitation light emitted from the semiconductor laser chip 11 of the semiconductor laser module is input through an optical fiber 21; and 103 and 104, optical fibers not having amplification function.

When the wavelength $\lambda_1$ of the diffraction grating $FG_1$ nearer to the input end surface of the optical fiber 21 is selected to be smaller than the wavelength $\lambda_2$ of the farther diffraction grating $FG_2$, the wavelength of input light given to the farther diffraction grating $FG_2$ from the semiconductor laser chip (LD) 11 can be prevented from being affected by the loss due to the clad mode of the diffraction grating $FG_1$ nearer to the LD 11.

When the absolute value $|\lambda_1 - \lambda_2|$ of the wavelength difference between the wavelengths $\lambda_1$ and $\lambda_2$ of the diffraction gratings $FG_1$ and $FG_2$ is selected to be not larger than 10 nm, the oscillation spectral bandwidth can be selected to be in a desired value range of not larger than 10 nm.

Further, when the reflectivity of the output end surface of the semiconductor laser chip (LD) 11 is selected to be not larger than 2% as exemplified above, oscillation at Bragg wavelengths of fiber gratings can be obtained. That is, when the LD reflectivity is larger than 2%, oscillation in the Fabri-Perot mode of the semiconductor laser chip (LD) 11 is apt to occur.

Figure 4:
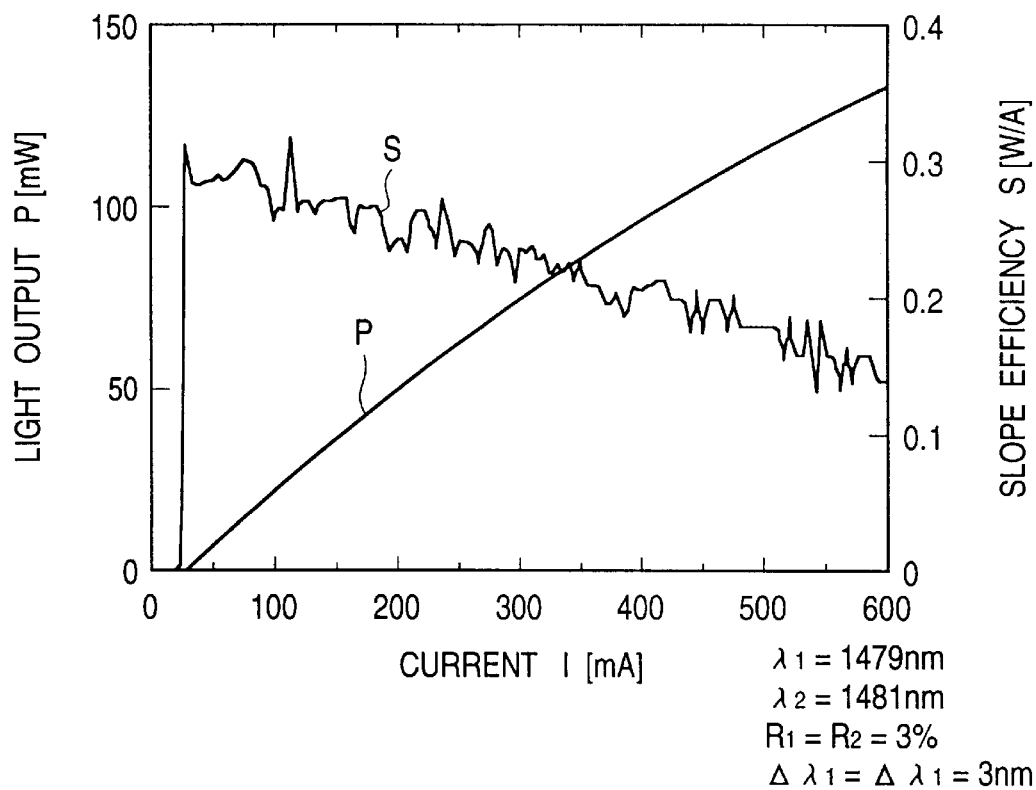
FIG. 4 is a graph showing an example of characteristic of the semiconductor laser module according to an embodiment of the present invention.

FIG. 4 shows measured characteristic as an example in the case where the wavelengths $\lambda_1$ and $\lambda_2$, the reflectivities $R_1$ and $R_2$ and the band widths $\Delta\lambda_1$ and $\Delta\lambda_2$ are selected to be $\lambda_1 = 1479$ nm, $\lambda_2 = 1481$ nm, $R_1 = R_2 = 3\%$ and $\Delta\lambda_1 = \Delta\lambda_2 = 3$ nm according to this invention. That is, light output P and its slope efficiency S having characteristic as shown in FIG. 4 with respect to the current I applied to the LD 11 are obtained. Accordingly, I-L characteristic free from kinks can be obtained, and stable light output can be obtained.

With respect to the slope efficiency S, as well known, the light intensity L in the I-L characteristic rises with a predetermined slope when the LD current reaches an emission threshold current $I_{th}$, and this slope $\Delta L/\Delta I$ is called the "slope efficiency".

Figure 5:
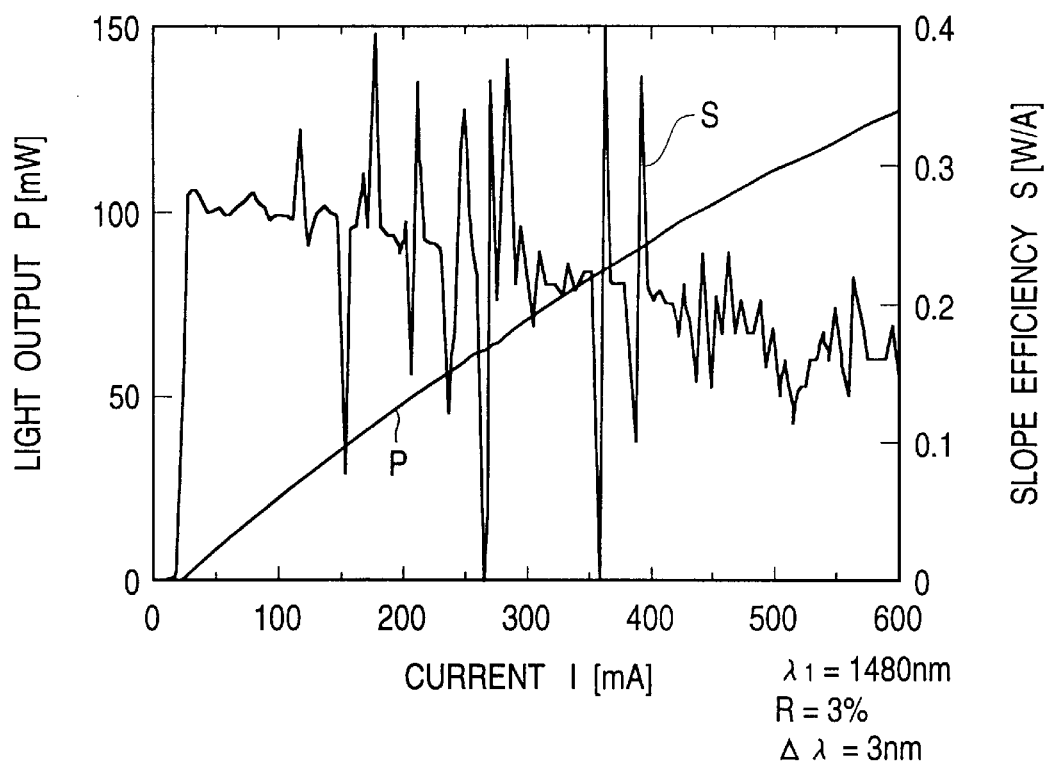

When only one diffraction grating with wavelength $\lambda = 1480$ nm, reflectivity R = 3% and band width $\Delta\lambda = 3$ nm is formed in the optical fiber in the same module structure as an comparative example, characteristic as shown in FIG. 5 is obtained, that is, the slope efficiency is widely fluctuated.

As is obvious from comparison between the characteristics shown in FIGS. 4 and 5, in the case where the optical fiber 21 has two diffraction gratings $FG_1$ and $FG_2$ (FIG. 4), I-L characteristic free from kinking can be obtained, that is, stable light output spectrum can be obtained compared with the case where the optical fiber 21 has only one diffraction grating (FIG. 5).

Further, three or more diffraction gratings $FG_1$, $FG_2$, $FG_3$, . . . can be produced successively in order of the nearer to the input end surface of the optical fiber 21. In this case, respective values are preferably selected to satisfy the following relations from the same reason as described above in the case of two diffraction gratings $FG_1$ and $FG_2$.

$\lambda_1 < \lambda_2 < \lambda_3 < \ldots$, $R_1, R_2, R_3, \ldots < 6\%$,
  preferably,
  $2\% \leq R_1, R_2, R_3, \ldots \leq 6\%$, $\Delta\lambda_1, \Delta\lambda_2, \Delta\lambda_3, \ldots \geq 2$ nm,
  preferably,
  $2$ nm $\leq \Delta\lambda_1, \Delta\lambda_2, \Delta\lambda_3, \ldots \leq 16$ nm, and $|\lambda_1 - \lambda_2|, |\lambda_1 - \lambda_3|, |\lambda_2 - \lambda_3|, \ldots \leq 10$ nm.

Oscillation at Bragg wavelengths can be obtained if the lower limit of each of the reflectivities $R_1, R_2, R_3, \ldots$ of the diffraction gratings $FG_1, FG_2, FG_3, \ldots$ is selected to be not smaller than 1% and the total reflectivity R as the sum of these reflection factors $R_1, R_2$. That is, $1\% \leq R_1, R_2, R_3, \ldots \leq 6\%$, or $2\% \leq R \leq 6\%$ is a preferred value concerning the reflectivities of these diffraction gratings.

Further, the plurality of diffraction gratings formed in predetermined regions of the optical fiber can be preferably achieved by overwriting in one and the same region of the optical fiber. FIG. 6 schematically shows an example in which two diffraction gratings $FG_1$ and $FG_2$ are overwritten in one and the same region. In FIG. 6, one diffraction grating $FG_1$ is represented by the solid line and the other diffraction grating $FG_2$ is represented by the broken line. Respective values of these diffraction gratings $FG_1$ and $FG_2$ are selected to satisfy the same relations as explained above with reference to FIG. 3. Three or more diffraction gratings may be overwritten in the same manner as described above. Also in this case, respective values of the diffraction gratings are selected in the same manner as described above.

When at least two diffraction gratings ($FG_1$ and $FG_2$) are formed in one and the same region of the optical fiber as described above, not only the FG formation region can be reduced but also output characteristic free from kinks can be obtained. Also in this case, each of the reflectivities ($R_1, R_2, \ldots$) of the diffraction gratings ($FG_1, FG_2, \ldots$) is preferably selected to be in a range of from 1 to 6% and the total reflectivity R as the sum of these reflectivities is preferably selected to be in a range of from 2 to 6% in the same manner as described above.

FIG. 7 shows a schematic longitudinally-sectioned view of a main part of the semiconductor laser module according to another embodiment of the present invention. The structure of the LD package 1 in this module is not particularly different from that in FIG. 1. For example, the reflectivity of the light emitting surface of the semiconductor laser chip 11 is preferably selected to be not larger than 2% in the same manner as described above. In the FG connector 2, on the other hand, a difference in external appearance is in that the ferrule 22 is supported and protected by a connector sleeve 29. The only point of difference optically or basically from the semiconductor laser module in FIG. 1 is in that the optical fiber 21 of the FG connector 2 has at least one chirped grating $FG_C$ in which the physical period of the refractive index variation changes continuously according to a second feature of the present invention. As well known, the chirped grating $FG_C$ means a grating in which each physical period of the refractive index variation changes continuously and monotonously. The chirped grating $FG_C$ also includes a grating in which each physical period of the refractive index variation changes randomly.

The physical period of the refractive index variation of this chirped grating $FG_C$ may be narrow on the side near the input side end surface of the optical fiber 21 while it is gradually spread along the travelling direction of the laser light, so that, schematically, FG reflection spectra as shown in FIG. 8 are exhibited. Hence, even in the case where, for example, the distance between the laser diode (LD) 11 and the chirped grating $FG_C$ is short, stabilized light output can be obtained.

In the case where the chirped grating $FG_C$ in which the physical period of the refractive index variation changes continuously is provided according to the second feature of the present invention, it is preferable from the same reason as described above in at least two diffraction gratings $FG_1$ and $FG_2$ with reference to FIG. 2 that the reflectivity $R_C$, mean wavelength $\lambda_C$ and line width $\Delta\lambda_C$ of the diffraction grating $FG_C$ are selected to satisfy the following relations:

$R_C \leq 6\%$, preferably, $2\% \leq R_C \leq 6\%$, and $\Delta\lambda_C \geq 2$ nm, preferably, $2$ nm $\leq \Delta\lambda_C \leq 16$ nm.

Also in the case where the chirped grating $FG_C$ is produced, this diffraction grating $FG_C$ is suitable for obtaining oscillation at Bragg wavelength when the reflectivity $R_C$ is selected to have a lower limit of 1% as represented by the two-dot chain line in FIG. 8 and satisfy the following relation.

$1\% \leq R_C \leq 6\%$

In addition, as similarly to the case shown in FIG. 6, a plurality of chirped gratings $FG_C$ may be overwritten in one and the same region.

In the semiconductor laser module according to the present invention, the structure and form thereof can be changed variously as exemplified above in FIGS. 1, 2 and 6 without departing from the thought thereof, and, further, may be changed as shown in FIG. 9. In the semiconductor laser module shown in FIG. 9, a casing 17 of the LD package 1 is extended. The optical fiber 21 supported by the fiber holder 22 enters this extended portion so as to be disposed in the LD package 1. The fiber holder 22 is fixed stably to the casing 17 and an inner wall 18 by a connector sleeve 30. Accordingly, in this example, the optical fiber 21 is protected strongly from various kinds of physical disturbance. Accordingly, stabler characteristic can be obtained and the size can be reduced compactly as a whole.

As described above, according to the present invention, a fiber grating (FG) for reflecting only light of a predetermined wavelength selected from output light from a semiconductor laser chip installed in a package of an optical fiber is provided in a place corresponding to the inside of the package or the inside of a coupling means. Further, the fiber grating is constituted by at least two diffraction gratings ($FG_1$ and $FG_2$) for reflecting light of different wavelengths respectively or constituted by a chirped grating ($FG_C$) in which the period of the refractive index changes continuously. Accordingly, not only the size in the direction of the optical path can be shortened but also light output oscillation spectra can be stabilized regardless of the reduction of the size. Consequently, a semiconductor laser module having output characteristic which does not change correspondingly to the external condition is obtained.

What is claimed is:

1. A semiconductor laser module comprising:

a semiconductor laser chip for emitting light;

a package in which said semiconductor laser chip is installed;

an optical fiber having a diffraction grating structure for reflecting light with a predetermined wavelength selected from the emitted light of said semiconductor laser chip; and a coupling means for coupling said package and said optical fiber to each other;

wherein said diffraction grating structure includes at least two diffraction gratings for reflecting light with different wavelengths respectively which are formed in a place corresponding to the inside of said package or the inside of said coupling means.

2. A semiconductor laser module according to claim 1, wherein the reflectivity of each of said diffraction gratings has a value of from 1 to 6%.

3. A semiconductor laser module according to claim 1, wherein the half-value width of the reflectivity of each of said diffraction gratings has a value of from 2 to 16 nm.

4. A semiconductor laser module according to claim 1, wherein the central value of the reflection wavelength of the diffraction grating nearest to an end surface of said optical fiber is the shortest wavelength.

5. A semiconductor laser module according to claim 1, wherein said at least two diffraction gratings are overwritten in one and the same region in said place.

6. A semiconductor laser module according to claim 1, wherein the total reflectivity of said at least two diffraction gratings has a value of from 2 to 6%.

7. A semiconductor laser module comprising:
   a semiconductor laser chip for emitting light;
   a package in which said semiconductor laser chip is installed;
   an optical fiber having a diffraction grating structure for reflecting light with a predetermined wavelength selected from the output light of said semiconductor laser chip; and
   a coupling means for coupling said package and said optical fiber with each other;
   wherein said diffraction grating structure includes at least one chirped grating in which a physical period of refractive index variation changes and which is formed in a place corresponding to the inside of said package or the inside of said coupling means.

8. A semiconductor laser module according to claim 7, wherein the reflectivity of said diffraction grating has a value of from 1 to 6%.

9. A semiconductor laser module according to claim 7, wherein the half-value width of the reflectivity of said diffraction grating has a value of from 2 to 16 nm.

10. A semiconductor laser module according to claim 7, wherein said diffraction grating is a chirped grating having the shortest grating width on its side near an end surface of said optical fiber.

11. An erbium-doped fiber amplifier comprising:
   a semiconductor laser module recited in claim 1, said semiconductor laser module generating an excitation beam;
   a light source generating a signal beam;
   an erbium-doped fiber; and
   a wavelength multiplexer/demultiplexer for optically coupling the signal beam and the excitation beam to the erbium-doped fiber.

12. An erbium-doped fiber amplifier comprising:
   a semiconductor laser module recited in claim 7, said semiconductor laser module generating an excitation beam;
   a light source generating a signal beam;
   an erbium-doped fiber; and
   a wavelength multiplexer/demultiplexer for optically coupling the signal beam and the excitation beam to the erbium-doped fiber.

* * * * *